(12) United States Patent
Yamamoto et al.

(10) Patent No.: US 7,144,547 B2
(45) Date of Patent: Dec. 5, 2006

(54) TARGET FOR CATHODE DISCHARGING ARC ION PLATING AND METHOD OF MANUFACTURING THE SAME

(75) Inventors: Kenji Yamamoto, Kobe (JP); Toshiki Sato, Kobe (JP); Yasuo Nakane, Takasago (JP); Hidekazu Morimoto, Takasago (JP); Yoichiro Yoneda, Takasago (JP)

(73) Assignee: Kabushiki Kaisha Kobe Seiko Sho (Kobe Steel, Ltd.), Kobe (JP)

( * ) Notice: Subject to any disclaimer, the term of this patent is extended or adjusted under 35 U.S.C. 154(b) by 346 days.

(21) Appl. No.: 10/396,406

(22) Filed: Mar. 26, 2003

(65) Prior Publication Data

US 2003/0217917 A1    Nov. 27, 2003

(30) Foreign Application Priority Data

Mar. 29, 2002    (JP)    ............................. 2002-093453

(51) Int. Cl.
  *B22F 3/15*    (2006.01)
  *B22F 3/17*    (2006.01)

(52) U.S. Cl. .......................................... 419/48; 419/49

(58) Field of Classification Search ................. 75/249; 419/49, 48; 204/298.12, 298.13
See application file for complete search history.

(56) References Cited

U.S. PATENT DOCUMENTS 6,517,688 B1 *    2/2003    Sakurai et al. ......... 204/192.35

6,602,390 B1 *    8/2003    Brandle et al. ........ 204/298.41

FOREIGN PATENT DOCUMENTS

| DE | 102 33 222 | 2/2003 |
| EP | 1 219 723 | 7/2002 |
| JP | 2644710 | 5/1997 |
| JP | 10-60636 | 3/1998 |

OTHER PUBLICATIONS

Patent Abstracts of Japan, JP 10-060636, Mar. 3, 1998.
Patent Abstracts of Japan, JP 2000-297365, Oct. 24, 2000.

* cited by examiner

*Primary Examiner*—Ngoclan T. Mai
(74) *Attorney, Agent, or Firm*—Oblon, Spivak, McClelland, Maier & Neustadt, P.C.

(57) ABSTRACT

In a target for cathode discharging arc ion plating containing Al and Cr as an essential ingredient according to the invention, the thickness of the Al and Cr compound layer formed between Cr particles and Al contained in a target is 30 μm or less. Alternatively, the total for the peak intensities of Al—Cr compound observed between diffraction angles between 10 to 80° by X-ray diffractiometry according to θ=2θ method is 10% or less relative to the total for the peak intensities of Al, Cr and the Al—Cr compound. Further, the relative density of the target is 92% or more. The target is capable of forming hard films of high quality while preventing not uniform movement of arc spots and suppressing formation of macro particles.

13 Claims, 4 Drawing Sheets

TARGET FOR CATHODE DISCHARGING ARC ION PLATING AND METHOD OF MANUFACTURING THE SAME

BACKGROUND OF THE INVENTION

1. Field of the Invention

The present invention concerns a target for cathode discharging arc ion plating used when the surface of a substrate such as a cutting tool or jig is covered with a hard film.

2. Description of the Related Art

The cathode discharging arc ion plating is a method of discharging an electron stream of a large capacity (several tens to several hundreds A) from the surface of a target constituting a cathode to an anode in vacuum during arc discharge, evaporating and ionizing the target by a Joule heating when electrons are emitted from the cathode, thereby conducting deposition on the surface of a substrate such as a cutting tool. An AlTi system target is mainly used as a target for cathode discharging arc ion plating for forming a hard film, for example, with nitrides or carbonitrides. A target comprising Al and Cr as an essential ingredient is sometimes also used for the formation of a hard film since the oxidation resistance is improved by using Cr instead of Ti in the AlTi system targets.

Upon arc discharging, arc spots (cathode spots) as electron emission points are formed on the surface of a target. A desired state of the arc spot is that one or plural arc spots are present during discharge and move at a high speed (several to several tens m/sec) and uniformly on the target. When movement of arc spots stagnate, melted portions referred to molten pool are formed near the stagnation portions. Then, the molten portions are scattered by the pressure increase along with explosive solid-gas phase conversion and deposited on the surface of the substrate. The deposited molten liquid droplets are referred to as macro particles which roughen the surface of the formed film and deteriorate the performance of the film.

In a case where the target is homogeneous comprising a single metal or single tissue, since spots tend to move uniformly on the surface of the target, problems less occur. On the other hand, when the target is inhomogeneous, that is, the composition comprises plural ingredient, or the tissue comprises plural phases, the spots less tend to move uniformly to result in a problem that macro particles are liable to be caused to the film.

As has been described above, while the use of a target comprising Al and Cr as an essential ingredient has been attempted as a target for cathode discharging arc ion plating, it is difficult to form a film of high quality and it has not yet reached a practical level at present. This is because the target comprises plural ingredients. In addition, since Cr tends to react more with Al compared with Ti or the like, Al—Cr compounds are formed easily in the course of target production. The Al—Cr compounds cause not uniform movement of spots which form macro particles.

As a relevant technique, Japanese Patent Laid-Open Hei 10-60636 describes a sputtering target comprising Al as a main ingredient and containing compound forming elements such as Ti and Zr. However, the patent publication does not specifically disclose a target contained Al and Cr as the essential ingredient. Further, in the patent publication, it is described that it may suffice to remain the element forming a compound with Al in the state of a metal or element in the target. Cr tends to react more easily with Al and form compounds, compared with Ti or the like. Particularly, in discharging arc ion plating, formation of the compounds per se gives an undesired effect on the arc discharging, while in sputtering it does not give such an effect. Accordingly, the technique of the patent publication above can bot prevent abnormal discharging or splash upon sputtering which is caused during fabrication by cracking of inter-metallic compound which is formed by reaction of Al and a compound forming elements in the matrix upon sintering.

SUMMARY OF THE INVENTION

The present invention has been accomplished in view of the foregoing problems. It is an object thereof to provide target for a cathode discharging arc ion plating containing Al and Cr as an essential ingredient, which can prevent not uniform movement of arc spots and, accordingly, capable of forming hard films of high quality with suppressed formation of macro particles, as well as a suitable manufacturing method thereof.

The present inventors have found that when an Al—Cr compound is formed between Al and Cr during arc discharging of a target containing Al and Cr as a main ingredient, there is a trend that the arc spots generate to discharge preferentially at a portion of the compound. The reason why the portion of the Al—Cr compound discharges preferentially is not always apparent at present, but it may be considered as below. Movement of the spots in arc discharging undergoes effects of factors such as atmosphere (vacuum, or introduction gas such as Ar and nitrogen), melting point of a target material and thermo-electron emission ratio. When discharging is conducted with such a target, indents in accordance with the shape of the Al—Cr compound layer formed around Cr particles are formed to the target. If such indents are formed, spots tend to be stagnated at the portion to cause localized discharge easily and indents or the periphery thereof discharge preferentially. When spots are stagnated to cause localized discharge as described above, thermal loads at the periphery thereof increase compared with discharge wherein the spots move at a high speed. The localized discharge tends to cause macro particles much more easily and forms unevenness in the composition, because of the preferential discharge near the Cr particles. Accordingly, controlling thickness of the Al—Cr compound eliminates formation of the Al—Cr compound layer and can solve the problem. Even if the Al—Cr compound is formed, the thickness of the Al—Cr compound can be controlled strictly within such a range as to give no undesired effect to the arc discharging (movement of arc spots).

The present invention has been accomplished with a technical view point described above. The target for cathode discharging arc ion plating according to the invention is a target for a cathode discharging arc ion plating containing Al and Cr as an essential ingredient wherein the thickness of a compound layer of Al and Cr formed between Cr particles and Al contained in the target is 30 μm or less, and the relative density is 92% or more. Alternatively, the total for the peak intensities of the Al—Cr compound is 10% or less relative to the total for the peak intensities of Al, Cr and the Al—Cr compound, and a relative density is 92% or more, when the peak intensities are observed between diffraction angle from 10 to 60° by X-ray diffractiometry according to θ=2θ method by using CuKα. In the present invention, the amount of Cr is preferably 5% or more by at %.

The essential ingredient above means that the total for Al and Cr in the target is 3% or more, preferably, 5% or more and the atom ratio between Al and Cr is Al:Cr=1:9 to 9:1 in the target.

As the target, those formed integrally from a powder mixture of an Al powder and a Cr powder by a hot forging method or an HIP method are suitable since the relative density can be increased easily.

Further, those having the following composition based on atom ratio are suitable as the target for forming a hard film:

$Ti_{1-a-b-c-d}$, $Al_a$, $Cr_b$, $Si_c$, $B_d$
$0.55 \leq a \leq 0.8$
$0.05 \leq b$
$0 \leq c+d \leq 0.1$
$a+b+c+d<1$.

Further, in the target described above, it is preferred that the number of Cr particles having a circle-equivalent diameter of 150 μm or more in the target is 10 or less in average when observed by five or more fields of view for the field of view 1.5 mm².

A preferred method of manufacturing the target is a method of forming by sintering a powder mixture of elements forming the target by an HIP method in which the processing temperature is lower than 520° C. and 420° C. or higher.

According to the target of the present invention, since the Al—Cr compound layer is suppressed to such a level as not causing localization of arc discharge irrespective that Cr highly reactive with Al contained as the essential ingredient, localized discharge less tends to occur on the surface of the target upon cathode discharging arc ion plating and, as a result, macro particles are less formed and hard films of homogeneous composition can be formed easily.

DESCRIPTION OF THE PREFERRED EMBODIMENT

The present inventors have closely observed and studied targets for cathode discharging arc ion plating containing Cr and Al as an essential ingredient, and the result of forming the film therewith. It has been found that the Al—Cr compound layer is formed at the periphery of Cr particles depending on the temperature hysteresis during manufacture of the target, arc discharge tends to occur preferentially at the portion of the Al—Cr compound layer and the localized discharge at the portion of the Al—Cr compound layer results in problems such as worsening of the surface roughness and unevenness in the composition due to macro particles to the formed film.

In order to solve the problems, as a result of the study on the relation between the thickness and the discharging property of the Al—Cr compound layer formed between Cr and Ar contained in the target manufactured while changing the conditions variously or the film characteristics, the following knowledge was obtained. That is, so long as the thickness of the Al—Cr compound layer is 30 μm or less, arc spots during arc discharging can move uniformly at a high speed over the entire surface of the target without localized discharge at the Al—Cr compound layer portion. Description is to be made more in details with reference to examples.

Figure 1:
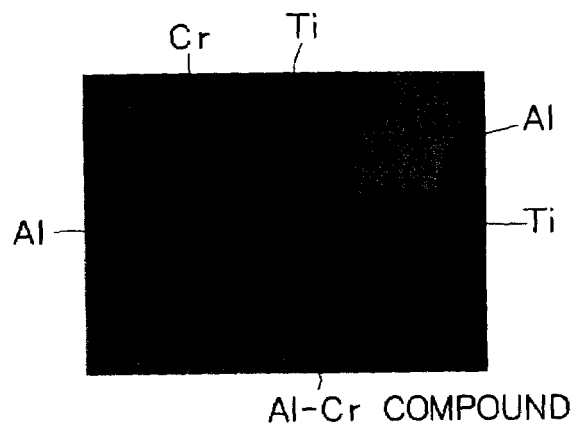
FIG. 1 is a photograph for tissue as a substitute for the drawing of an AlCrTi target in which an Al—Cr compound layer is formed at the periphery of Cr particles.

FIG. 1 shows a micro-tissue of a target material (relative density: 99% or more) comprising Al, Cr and Ti (Al: Cr: Ti=72:18:10 based on atom ratio) manufactured by an HIP method under the processing conditions of 550° C., 100 MPa and 2 hr of retention time. Thus, an Al—Cr compound layer was observed between Al and Cr particles and the average thickness was measured to be 50 μm. As the method of measuring the thickness of the compound layer, Cr particles were observed by the number of about 10 under an optical microscope at a magnifying factor of 200 to 400×, and an average thickness was determined by drawing a line perpendicular to the surface of the Cr particles to measure the thickness of the compound layer and then averaging them for the result of the total measurement. Under the temperature condition, formation of the Al—Ti compound layer was not observed between Al and Ti.

Figure 2:
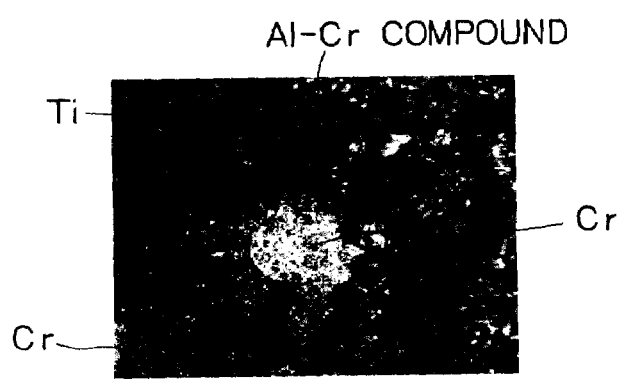
FIG. 2 is a photograph for a tissue as a substitute for the drawing on the target surface after conducting cathode discharging arc ion plating by using a target shown in FIG. 1.

A target of 100 mm diameter (16 mm thickness) was manufactured by using the target material. The target was attached to a cathode discharge arc ion plating apparatus and the surface property was measured when conducting arc discharge for an extremely short period of time (about 0.5 sec) by an arc current of 150 A and at a nitrogen gas pressure of 2.66 Pa. FIG. 2 shows the result. In the drawing, a portion appearing black is a portion through which arc discharge was passed. It can be apparently seen that arc discharge was caused preferentially to the Al—Cr compound portion formed around Cr and, as a result, indents are formed at the periphery of the Cr particles.

Figure 3:
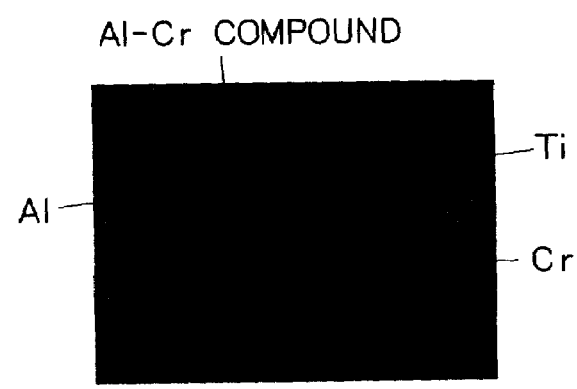
FIG. 3 is a photograph for a tissue as a substitute for the drawing of an AlCrTi target in which an Al—Cr compound layer is formed to a portion at the periphery of Cr particles.

On the other hand, FIG. 3 shows a tissue manufactured from the target material of the composition described above by an HIP method under the conditions at 500° C., 100 MPa and for 2 hrs. Under the conditions, the compound layer was observed only at a restricted portion around the Cr particles. The thickness of the compound was about 10 to 15 μm as a result of the same measurement described above. Also in this case, the Al—Cr compound was formed. However, the Al—Cr compound caused less effect on the arc discharge because it was formed only partially and the thickness was 30 μm or less. When cathode discharge arc plating was conducted under the same conditions as those described above and the surface was measured, localized arc discharging portion was scarcely observed.

Figure 4:
FIG. 4 is a photograph for a tissue as a substitute for the drawing of an AlCrTi target in which an Al—Cr compound layer is not formed.
Figure 5:
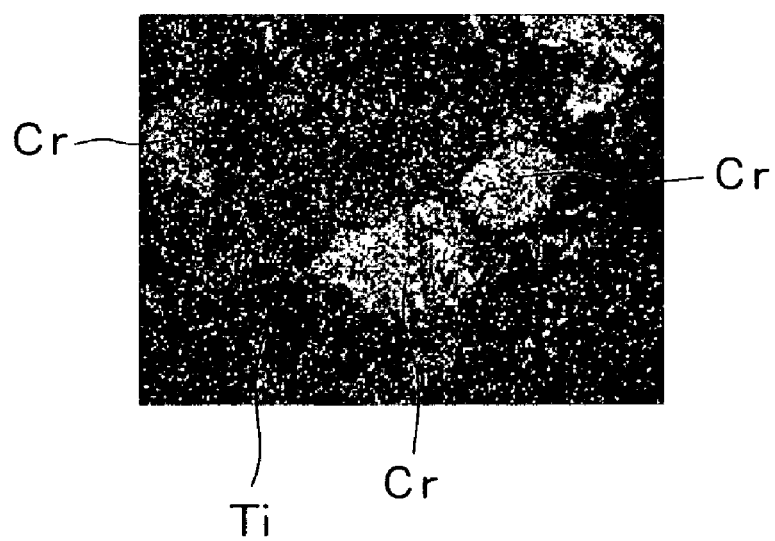
FIG. 5 is a photograph for a tissue as a substitute for the drawing on the target surface after conducting cathode discharging arc ion plating by using a target shown in FIG. 4.

Further, FIG. 4 shows a tissue for the target material of the composition described above prepared by the HIP method under the conditions at 100 MPa, 485° C. and for 2 hr. Under the conditions, formation of the Al—Cr compound layer between Al and Cr was not observed at all. FIG. 5 shows the surface shape using the target after conducting cathode discharging arc ion plating under the same conditions as described above and conducting arc discharging. It can be seen in this example, that since the compound layer was not formed between Al and Cr, discharge was not localized, arc discharge was formed uniformly and the surface was evaporated uniformly. As a matter of fact, formation of indents due to localization of discharge as observed in FIG. 2 was not observed.

It has been found that the thickness of the Al and Cr compound layer has to be reduced to 30 μm or less for ensuring uniform movement of arc spots and suppressing occurrence of micro particles, in view of the result of the observation and examples to be described later. Preferably it is 15 μm or less and, more preferably, it is 5 μm or less. When the Al—Cr compound layer is about 5 μm, this is a level that the compound layer can not substantially be observed even under observation by an optical microscope at a magnification factor of about 500×.

In the method of measuring the thickness of the compound layer by the optical microscope, in a case of examining targets used actually, it is necessary to conduct tissue observation by the operation such as cutting and, polishing and etching of targets. The operation may be sometimes difficult with a practical point of view. Then, as a method of non-destructive observation of the target for the state of forming the Al—Cr compound, the Al—Cr compound may be identified by X-ray diffractiometry, and the amount (ratio) of the Al—Cr compound present in the target relative to Al and Cr as the matrix may be regarded as the thickness of the Al—Cr compound. Further, in the X-ray diffractiometry, since average information for a larger region can be obtained compared with that of the optical microscopic observation with restricted field of view, quantitative determination is possible even in a case where the Al—Cr compound is formed partially at the periphery of Cr particles.

Figure 6:
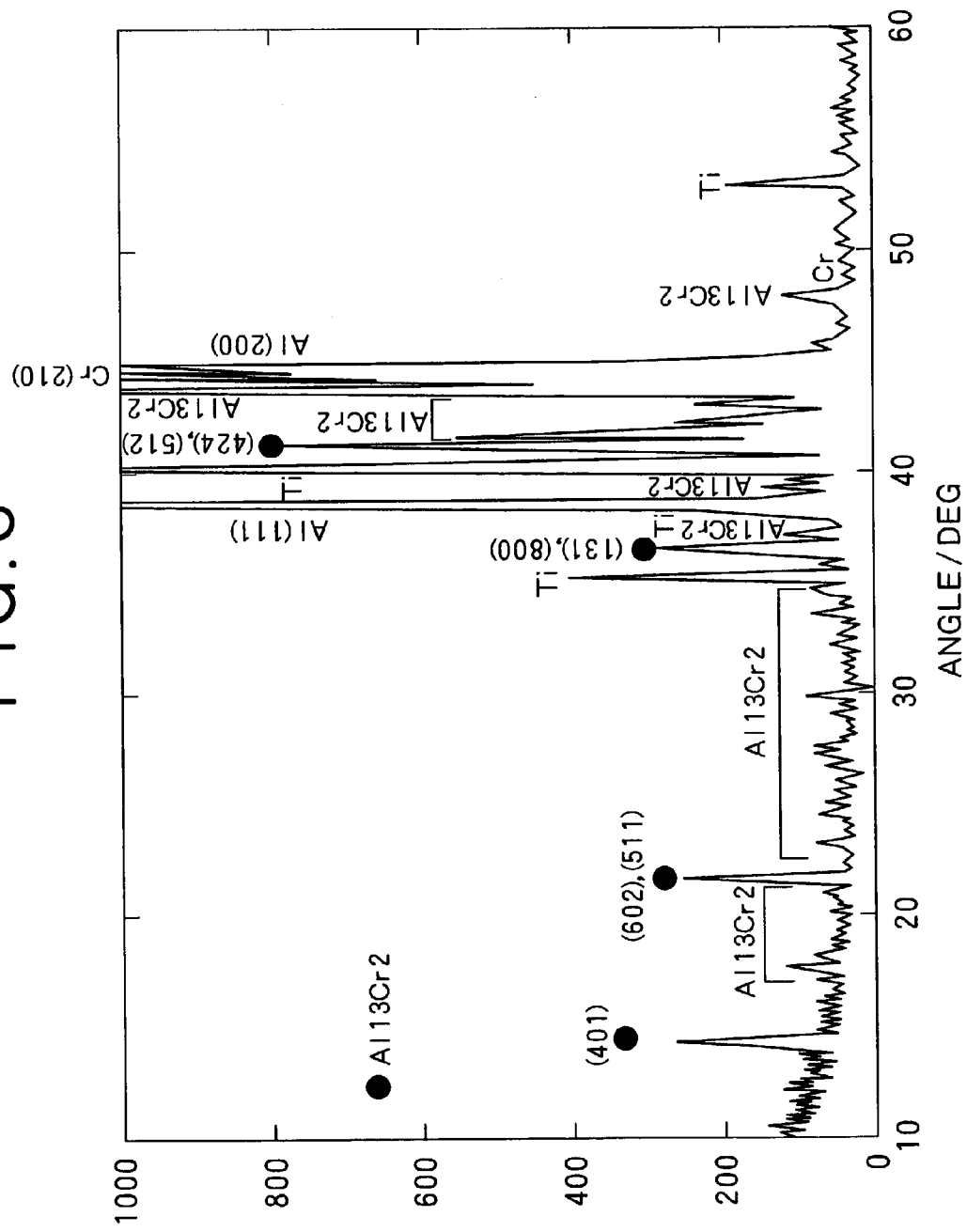
FIG. 6 is an X-ray diffraction pattern diaphragm for an AlCrTi target.
Figure 7:
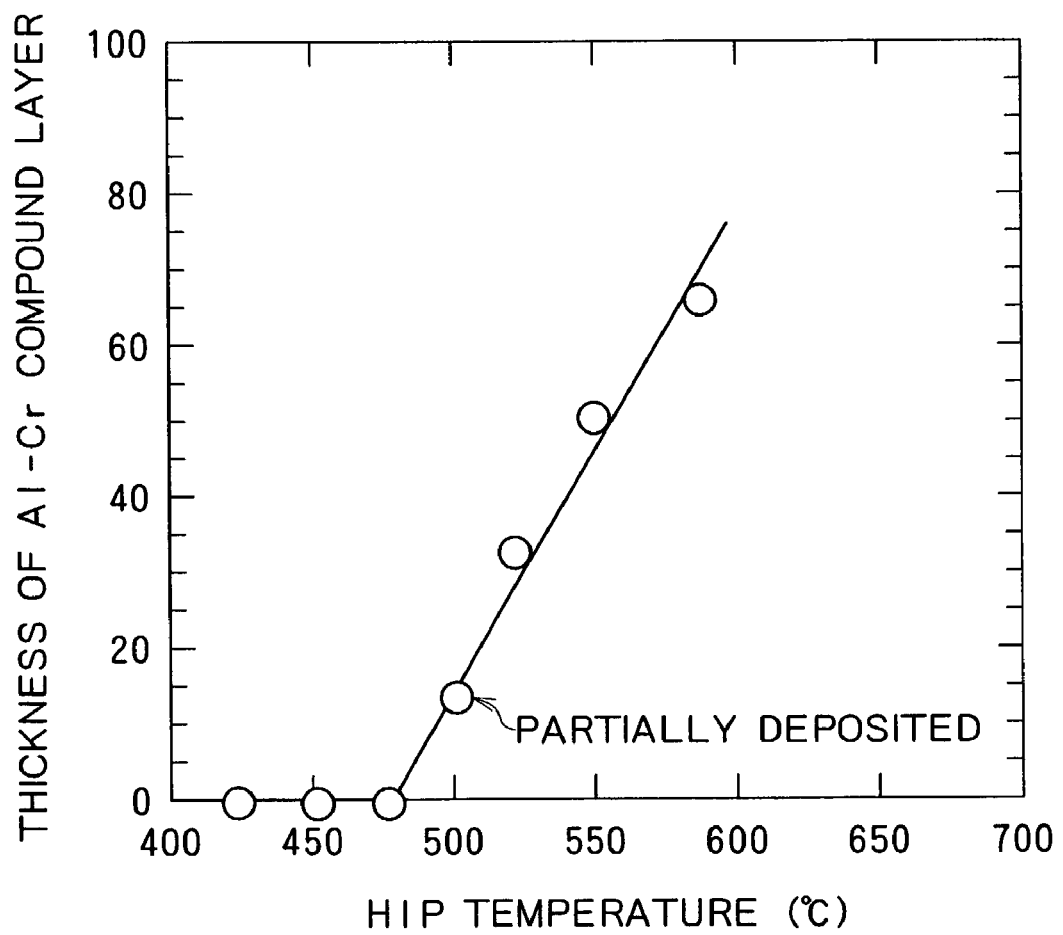
FIG. 7 is a graph showing a relation between the HIP temperature and the thickness of Al—Cr compound layer when a target is manufactured by an HIP method.

Specifically, in X-ray diffractiometry with θ=2θ method using CuKα rays as a source, the total for the intensities of specific peaks attributable to the Al—Cr compound observed at diffraction angles of 10 to 60° are divided by the total for the intensities of specific peaks attributable to Al, Cr and the Al—Cr compound, and the value obtained is multiplied by the number of 100, which is defined as the compound amount (%) of Al—Cr contained in the target. FIG. 6 shows an X-ray diffraction pattern at diffraction angles from 10 to 60° relative to the target shown in FIG. 1. By the X-ray diffraction pattern, $Al_{13}Cr_2$ was identified as the Al—Cr compound in addition to the Al, Cr and Ti. Many diffraction lines are observed in the diffraction angles for $Al_{13}Cr_2$. Most of the diffraction lines are weak in the intensity and some of them overlap with peaks for Al and Cr. Then, (401) face, (602, 511) faces, (131, 800) faces and (424, 512) faces were selected for the peaks of $Al_{13}Cr_2$ having relatively strong intensity and with less overlap with other diffraction lines. The total for the intensities of the peaks of the selected faces were defined as the total for the intensities of diffraction lines attributable to the Al—Cr compound. The peaks described above are observed at the diffraction angles of 14.08, 21.49, 36.56 and 41.46° each as 2θ in a standard powder pattern described in JCPSDS card 29-14. The (111) face and the (200) face were used for the Al diffraction lines and the (210) face was used for the Cr diffraction lines. The amount of the Al—Cr compound amount was determined in accordance with the following equation assuming the intensity of each diffraction line as: I (hkl):

$$\text{Al—Cr compound amount (\%)} = [Al_{13}Cr_2 I(401) + I(602, 511) + I(131, 800) + I(424, 512)] /$$
$$([Al_{13}Cr_2 I(401) + I(602, 511) + I(131, 800) + I(424, 512)] +$$
$$[Al\, I(111) + I(200)] + [Cr\, I(210)] * 100$$

As a result of the study on the relation between the amount of the Al—Cr compound defined by the X-ray diffractiometry and the discharging property or the film property, it has been confirmed that the effect of the compound layer, if formed, was little when the amount of the Al—Cr compound was 10% or less. Preferably, it is 6% or less and, more preferably, 3% or less. It is most preferred that the peak attributable to $Al_3Cr_2$ was scarcely observed by the X-ray diffractiometry, that is, the peak from (424, 512) faces as the strongest line is about equal with the background. In this case, the amount of the Al—Cr compound determined by calculation is 1% or less.

It may suffice that the target of the present invention can satisfy the conditions for the thickness of the Al—Cr compound layer or the amount of the Al—Cr compound determined by the X-ray diffractiometry. There is no restriction for the manufacturing method of the target. For example, the target can be manufactured by an atmospheric pressure sintering, hot forging or HIP. It is preferred to use the hot forging method or the HIP method. The HIP method is most recommended. This is because: the relative density is low in the atmospheric pressure sintering since the pressure is scarcely applied; on this condition, vacant holes are formed inside; and this tends to cause the arc discharging to be instable due to degasing from the vacant holes during discharge. Further, in the melting method, since the specific gravity is greatly different between Al and Cr, unevenness of the composition in one identical target tends to be increased. In contrast, in the hot forging and HIP method, the density can be increased up to about 100% depending on the conditions and there is no problem of segregation by the use of an appropriate powder mixing method. In the hot forging method, since the size of the target that can be manufactured is generally small and is not sometimes suitable to mass production, the HIP method is recommended more.

It is necessary that the relative density of the prepared target is 92% or more in any of the manufacturing methods. When the relative density is lower than 92%, since a lot of vacant holes are incorporated in the target. Therefore, when the target is consumed after starting arc discharge to expose the vacant holes to the surface, the arc discharge becomes instable by the emission of gases from the vacant holes. This is not desirable in view of the stability of the process. It is preferably 95% or more, more preferably, 98% or more and, further preferably, 99% or more.

As a method of defining the relative density, for example, in a case of a target comprising Al and Cr at 50:50 by atom ratio (34.16:65.84 by mass ratio), since the density for Al and Cr is 2.7 and 7.2. g/cm³ respectively, the theoretical density for 100% relative density with no vacant holes is 4.74 g/cm³. The relative density is obtained as a value by dividing the value of the specific gravity of an actual target measured by an Archimedes' method or the like with the theoretical density described above and multiplying by the number of 100. Also in a case where other elements (Ti and the like) are contained in the target, the relative density can be calculated basically by the same calculation method. Actually, when compounds such as Al—Cr are deposited in the target, it is somewhat deviated from the theoretical density obtained by calculation assuming that all the components as pure metal, but it has been confirmed in the invention that the theoretical density defined by the method described above is effective as an index.

The target of the invention contains Al and Cr as the essential ingredient. The essential ingredient means that the total for Al and Cr in the target is 3% or more, preferably, 5% or more and the atom ratio between Al and Cr is Al:Cr=1:9 to 9:1 in the target. This is because the Al—Cr compound is formed in the target when such amounts of Al and Cr are contained. There is no particular restriction on the contained elements other than Al and Cr. Metal elements forming, together with Al and Cr, hard compounds such as nitrides, carbonitrides and composite nitrides can be added. The metal elements are, for example, Ti, Si, B, Ta, Nb and W.

The amount of Cr is particularly effective when it is contained, preferably, by 5 at % of more and, more preferably, 10 at %. This is because even when reaction is taken place between Cr and Al, if the amount of the Cr is about several at %, the proportion of the compound in the entire target is decreased to reduce the effect given on the discharging property or film property. When Cr is contained by 5 at % or more, the ratio of the Al—Cr compound contained in the target also increases and the effect given on the discharging property or the property of the formed film increases. Since the situation is the same when Al is smaller, the effect is small with the Cr amount of 90% or more.

Example of preferred target compositions can include the following The target compositions are particularly effective upon forming hard films. Each of the following a–d represents atom ratio.

$Ti_{1-a-b-c-d}$, $Al_a$, $Cr_b$, $Si_c$, $B_d$
$0.55 \leq a \leq 0.8$
$0.06 \leq b$
$0 \leq c+d \leq 0.1$
$a+b+c+d<1$.

The nitride or carbonitride film formed by using the target and by the cathode discharging arc ion plating is a film represented by $(Ti_{1-x}Al_x)$ $(C_{1-y}N_y)$ disclosed in Japanese Patent No. 2644710 [$0.55 \leq x \leq 0.765$, $0.5 \leq y \leq 1$] (hereinafter as TiAlCN) in which the Ti portion is replaced with Cr or further with Si, B (also including case of c=0, d=0). Hardness and the oxidation resistance of the film can be improved compared with the original TiAlCN film.

According to the patent literature described above, the TiAlCN film is based on the cubic rock salt structure. As the amount of Al is increased, it transfers to the hexagonal wurtzite structure at the amount of Al between 0.6 and 0.7, lowering the film hardness remarkably. In contrast, the film formed by using the target described above has the cubic rock salt structure even at higher Al concentration of a: 0.55 or more and 0.8 or less by adding Cr at 0.06 or more, developing higher hardness than TiAlCN described above. Further, since the amount of Al as the oxidation resistance improving element is increased and Cr or Si, B which is an element of excellent oxidation resistance compared with Ti is added within the range described above, the oxidation start temperature is at 1000° C. or higher in the film using the target described above, whereas it is about 850° C. in existent TiAlCN. Accordingly, a film of excellent oxidation resistance is formed by using the target.

The present inventor has found that in a case of forming the film by using the target of the composition identical with the film described above, the property of the film, among the nitride film or carbonitride film containing Al, Cr, is effectuated, particularly, by the Al—Cr compound contained in the target. The film has a feature in having a high Al concentration and having the cubic rock salt structure as the hard layer. However, when a target having the thickness of the Al—Cr compound layer exceeding 30 μm is used, a great amount of macro particles are incorporated in the layer, so that the surface roughness is deteriorated, the cutting property is degraded and the phase of the hexagonal wurtzite structure as the soft layer tends to be deposited. While detailed mechanisms that the soft layer tends to be deposited are not yet apparent at present, it may be considered as below. That is, in the case of the arc ion plating method, atoms evaporated from the target are highly ionized (to about 80%), are accelerated by the voltage applied on the substrate and give ionic impact to the film during growing. It has been found in a case of this film that the ionic impact is particularly important for depositing the phase of the cubic rock salt structure. Since macro particles released from the target are neutral clusters emitted from the molten pools, containment of them by a great amount in the film decreases the ratio of the ionized particles and, as a result, the soft layer is increased. This trend is particularly conspicuous in a case of using a target at a high Al content. At the Al content of: $0.6 \leq a$, it is particularly effective to use a target with the Al—Cr compound layer of 30 μm or less, preferably, 15 μm or less. It is further effective at $0.65 \leq a$ to use such a target. Further, since the ratio of the Al—Cr compound formed is small where the amount of Cr is small, it is particularly effective to use a target with the Al—Cr compound layer of 30 μm or less, preferably, 15 μm or less at the Cr content of 5 at % or more and, preferably, 10% or more.

Further, in the target for cathode discharging arc ion plating containing Al and Cr as the essential ingredient, it is preferred that Cr particles with the circle-equivalent diameter of 150 μm or more contained in the target are present by the number of 10 or less in average when observed for five or more of fields of view at a field of view of 1.5 mm². The reason is as described below. According to the knowledge of the present inventor, it has been found that even a target not substantially containing the Al—Cr compound, if the circle-equivalent diameter of Cr is 150 μm or more, discharge less occurs for the portion of the Cr particles. As a result, arc tends to be localized to the periphery of the Cr particles. However, when the number of the Cr particles with the circle-equivalent diameter of 150 μm or more is 10 or less in average when observed for the fields of view described above, they give less effect on the film property. With respect to the circle-equivalent diameter of Cr, it is preferred that number of those with 105 μm or more is 10 or less and, more preferably, the number of those with 75 μm or more is 10 or less when observed according to the standards described above. Regarding the number of particles, 5 or less is more preferred. Since the powder used for the target has a distribution in view of the grain size and the shape is not always spherical, the area of a Cr particle appearing on the cut cross section of the target is measured and the size of the Cr particle is defined according to the diameter of a circle having the same area (circle-equivalent diameter) in the present invention.

The target of the invention can be manufactured by various methods as described above. In a particularly preferred HIP method, it is necessary that the processing temperature is 425° C. or higher and lower than 520° C. FIG.

7 is a graph showing a relation between the thickness of the Al—Cr compound layer and the HIP temperature (processing temperature) for the target comprising Al, Cr and Ti (atom ratio Al:Cr:Ti=72:18:10) prepared at a processing pressure of 100 MPa and for a processing time of 2 hr while varying the processing temperature. When the processing temperature exceeds 520° C., the thickness of the compound layer exceeds 30 μm which is not desirable. On the other hand, when the processing temperature is lower than 420° C., the relative density of the target is less than 92%, which means that a lot of vacant holes are contained in the target. The mechanical strength of the target is deteriorated, which is not preferred. A more preferred processing temperature range is from 450 to 500° C. The processing pressure may be about from 50 to 200 MPa in accordance with a customary method and the processing time in this case may be about from 1 to 3 hr. In short, appropriate processing pressure and the processing time may be selected under the range of the processing temperature described above such that the relative density is 92% or more, preferably, 95% or more and, further preferably, 98% or more.

In the formation of the Al—Cr compound, temperature is the most dominant factor. Accordingly, the preferable range of the processing temperature above is considered to be effective irrespective of the other conditions, such as processing pressure or composition of the target.

The present invention is to be described more specifically by way of examples. The invention is not construed limitatively by such examples.

EXAMPLE 1

As shown in Table 1, Al—Cr and Al—Cr—Ti were selected as the target composition and target materials were prepared by HIP, hot forging or melting method under the conditions shown in the table. The thickness of the Al—Cr compound layer formed between Cr and Al in the prepared target was observed by an optical microscope at a magnifying factor of 200×, and measured by the measuring method described above. Further, the relative density was measured. The results of measurement are collectively shown in Table 1.

Targets (100 mm diameter, 16 mm thickness) were fabricated from the target materials (starting materials). The targets were attached to a cathode discharging arc ion plating apparatus and hard films of about 3 μm were formed on mirror finished super-hard alloy substrates (surface roughness Ra: about 0.01 μm) at an arc current of 150 A, under a nitrogen pressure of 2.66 Pa, at a substrate temperature of 550° C., and at a substrate voltage within a range from 50 to 150 V. The films were evaluated based on the film hardness (Vicker's hardness: load 25 gf, retention time of 15 sec) and surface roughness (Ra). The results of evaluation are also shown in Table 1.

According to Table 1, examples of the invention at an HIP temperature of lower than 520° C. and 420° C. or higher have the thickness of the compound layer of 25 μm at the greatest and favorable film hardness and surface roughness were obtained. In Comparative Examples Nos. 11–13 at a processing temperature of 520° C. or higher, reaction between Al and Cr was vigorously taken place, the thickness of the compound was 45 μm or more, and degradation of hardness and lowering of the surface roughness were remarkable. In Nos. 2 and 5 at the HIP temperature of lower than 420° C., although the compound layer was not formed, the relative density lowered remarkably and deterioration of the film hardness and the surface roughness were also large. In the Specimen No. 1 prepared by the melting method, Al and Cr are reacted entirely to remarkably lower the film hardness and the surface roughness.

TABLE 1

| Specimen No. | Target composition at % | | | Target preparation condition | | | | Thickness of target compound layer (μm) | Relative density (%) | Film property | | Remarks |
| | Al | Cr | Ti | Method | Processing Temperature (° C.) | Processing Pressure (MPa) | Processing time (hr) | | | Film hardness (Hv) | Surface Roughness Ra (μm) | |
| --- | --- | --- | --- | --- | --- | --- | --- | --- | --- | --- | --- | --- |
| 1 | 50 | 50 | | Melting method | 900 | Ordinary pressure | 1 | Reacted entirely | 100 | 1650 | 0.24 | Comp. Example |
| 2 | 50 | 50 | | HIP | 400 | 70 | 2 | 0 | 91 | 1700 | 0.26 | Comp. Example |
| 3 | 50 | 50 | | Hot forging | 300 | 600 | — | 0 | 97 | 2650 | 0.18 | Example |
| 4 | 50 | 50 | | HIP | 485 | 100 | 2 | 0 | 100 | 2850 | 0.13 | Example |
| 5 | 70 | 20 | 10 | HIP | 400 | 80 | 2 | 0 | 91 | 2800 | 0.19 | Comp. Example |
| 6 | 70 | 20 | 10 | HIP | 425 | 100 | 2 | 0 | 96 | 3500 | 0.13 | Example |
| 7 | 70 | 20 | 10 | HIP | 450 | 100 | 2 | 0 | 100 | 3500 | 0.1 | Example |
| 8 | 70 | 20 | 10 | HIP | 475 | 100 | 2 | 0 | 100 | 3650 | 0.08 | Example |
| 9 | 70 | 20 | 10 | HIP | 500 | 100 | 2 | 10* | 100 | 3600 | 0.08 | Example |
| 10 | 70 | 20 | 10 | HIP | 510 | 100 | 2 | 25 | 100 | 3300 | 0.12 | Example |
| 11 | 70 | 20 | 10 | HIP | 530 | 100 | 2 | 45 | 100 | 2800 | 0.19 | Comp. Example |
| 12 | 70 | 20 | 10 | HIP | 550 | 100 | 2 | 505 | 100 | 2700 | 0.23 | Comp. Example |
| 13 | 70 | 20 | 10 | HIP | 600 | 100 | 2 | 67 | 100 | 2650 | 0.31 | Comp. Example |
| 14 | 70 | 20 | 10 | HIP | 500 | 70 | 2 | 5 | 100 | 3550 | 0.15 | Example |

Note:
*For compound layer thickness (numerical value): compound layer formed partially at the periphery of Cr particles

EXAMPLE 2

As shown in Table 2, Al—Cr was selected for the target composition and targets were manufactured by the HIP method while changing manufacturing conditions variously. The amount (ratio) of the Al—Cr compound contained in the targets was measured by the X-ray diffractiometry. The relative density in all targets was 99% or more.

Then, in the same manner as in Example 1, films were formed respectively to about 3 μm to mirror-finished super hard alloy substrates, and the surface roughness of the film was evaluated by the same method as in Example 1. The result of measurement and the result of evaluation were shown collectively in Table 2.

According to Table 2, the surface roughness of the formed films exhibited poor trend in a case of containing a great amount of Al generally having a low melting point and tending to release macro particles, whereas films of favorable surface roughness were formed in examples at a compound ratio of 10% or less in the comparison using targets of an identical composition.

TABLE 2

| Specimen No. | Target composition at % Al | Cr | Ratio of target compound layer % | Surface roughness Ra μm | Remarks |
|---|---|---|---|---|---|
| 1 | 80 | 20 | 0.2 | 0.19 | Example |
| 2 | 80 | 20 | 4.0 | 0.26 | Example |
| 3 | 80 | 20 | 7.3 | 0.21 | Example |
| 4 | 80 | 20 | 15.0 | 0.35 | Comp. Example |
| 5 | 50 | 50 | 1.0 | 0.1 | Example |
| 6 | 50 | 50 | 3.0 | 0.15 | Example |
| 7 | 50 | 50 | 8.3 | 0.19 | Example |
| 8 | 50 | 50 | 30.0 | 0.28 | Comp. Example |
| 9 | 30 | 70 | 0 | 0.08 | Example |
| 10 | 30 | 70 | 4.1 | 0.12 | Example |
| 11 | 30 | 70 | 6.7 | 0.15 | Example |
| 12 | 30 | 70 | 25.0 | 0.22 | Comp. Example |

EXAMPLE 3

As shown in Table 3, Al—Cr—Ti, Al—Cr—Ti—Si and Al—Cr—Ti—Si—B were selected as the target composition and targets were prepared by the HIP method at various temperature conditions as shown in Table 3 (processing pressure: 100 MPA, processing time 2 hr). The thickness of the Al—Cr compound layers contained in the prepared targets was determined by optical microscopic observation in the same manner as in Example 1. The relative densities of all the targets were 99% or more.

Nitride films were formed by an arc ion plating apparatus in the same method as in Example 1 for the prepared target, and the crystal structure of the films was identified by X-ray diffractiometry at θ-2θ, and the film hardness and the surface roughness were measured. Conditions during film deposition were at an arc current of 150 A, at a nitrogen pressure of 2.66 Pa, at a substrate temperature of 550° C. and at a substrate voltage of 150V with the film thickness being constant at about 3 μm.

The result of measurement is shown in Table 3. According to the Table, when comparison was made between targets of identical composition, films formed of targets in which thickness of the Al—Ti compound layer did not satisfy the conditions of the present invention (Nos. 3, 4, 8, 11, 12 and 14) had poor surface roughness, had the crystal structure in which hexagonal wurtzite structure is mixed with the desired cubic rock salt structure and showed low hardness.

TABLE 3

| Specimen No. | Target composition at % Al | Cr | Ti | Others | HIP Processing temperature (° C.) | Thickness of target compound layer (μm) | Film crystal structure | Film property Film hardness (Hv) | Surface roughness (μm) | Remarks |
|---|---|---|---|---|---|---|---|---|---|---|
| 1 | 60 | 20 | 20 | | 450 | 0 | Cubic | 3300 | 0.08 | Example |
| 2 | 60 | 20 | 20 | | 480 | 0 | Cubic | 3350 | 0.09 | Example |
| 3 | 60 | 20 | 20 | | 550 | 54 | Cubic + Hexa(w) | 2800 | 0.09 | Comp. Example |
| 4 | 60 | 20 | 20 | | 600 | 67 | Cubic + Hexa(w) | 2650 | 0.23 | Comp. Example |
| 5 | 72 | 18 | 10 | | 480 | 0 | Cubic | 3500 | 0.11 | Example |
| 6 | 72 | 18 | 10 | | 500 | 0 | Cubic | 3500 | 0.1 | Example |
| 7 | 72 | 18 | 10 | | 510 | 94 | Cubic | 3500 | 0.15 | Example |
| 8 | 72 | 18 | 10 | | 560 | 57 | Cubic + Hexa(w) | 2950 | 0.27 | Comp. Example |
| 9 | 70 | 18 | 10 | Si:2 | 475 | 0 | Cubic | 3650 | 0.08 | Example |
| 10 | 70 | 18 | 10 | Si:2 | 485 | 0 | Cubic | 3450 | 0.12 | Example |
| 11 | 70 | 18 | 10 | Si:2 | 540 | 45 | Cubic + Hexa(w) | 2750 | 0.18 | Comp. Example |
| 12 | 70 | 18 | 10 | Si:2 | 620 | 70 | Cubic + Hexa(w) | 2550 | 0.25 | Comp. Example |
| 13 | 68 | 19 | 10 | Si:2 B:1 | 485 | 0 | Cubic | 3550 | 0.01 | Example |
| 14 | 68 | 19 | 10 | Si:2 B:1 | 550 | 504 | Cubic + Hexa(w) | 2700 | 0.21 | Comp. Example |

Note:
(1) Compound layer thickness with *:partially deposited
(2) Film crystal structure
(3) Cubic: cubic rock salt, hexa: hexagonal wurtzite structure W: weak, M: medium, S: strong

EXAMPLE 4

As shown in Table 4, Al—Cr—Ti (72:18:10 atom %) was selected as the target composition and targets were prepared by the HIP method while variously changing the grain size of Cr particles as the starting material. HIP processing conditions were in common with each of the specimens and were at a temperature of 485° C., at a pressure of 100 MPa and for a processing time of 2 hr. The prepared targets were observed under an optical microscope at a magnification factor of about 100× for 10 fields of view to investigate the circle-equivalent diameter and the number of Cr particles contained in an area of 1.5 m². For the specimens (all examples of the invention), formation of Al—Cr compound was not observed at all. Further, the relative density was 99% or more in all the cases. Nitride films of about 3 μm were formed on mirror finished superhard alloy substrates by the same method as in Example 1 to measure the surface roughness of the films.

Table 4 shows the results of the measurement. According to Table 4, films formed by using the targets generally had favorable surface property. Particularly, specimens Nos. 2–10 containing 10 or less of Cr particles each having the grain size of 150 μm or more as the circle-equivalent diameter and Nos. 5–10 containing zero Cr particles having the grain size of 150 μm or more and 10 or less of particles having the grain size of 105 μm or more are excellent in the surface roughness.

TABLE 4

| Specimen No. | Cr particles in target | | | Film property |
|---|---|---|---|---|
| | Number of particles (≧150 μm) | Number of particles (≧105 μm) | Number of particles (≧75 μm) | surface roughness Ra (μm) |
| 1 | 25 | | | 0.19 |
| 2 | 8 | | | 0.15 |
| 3 | 7 | | | 0.12 |
| 4 | 0 | 25 | | 0.11 |
| 5 | 0 | 9 | | 0.1 |
| 6 | 0 | 4 | | 0.1 |
| 7 | 0 | 0 | 23 | 0.09 |
| 8 | 0 | 0 | 12 | 0.08 |
| 9 | 0 | 0 | 4 | 0.07 |
| 10 | 0 | 0 | 0 | 0.05 |

We claim:

1. A method of manufacturing a target for cathode discharging arc ion plating, comprising:
   sintering a powder mixture of elements forming the target by a HIP method in which a processing temperature is 420° C. to 485° C.;
   wherein said target comprises
   Al and Cr,
   wherein the thickness of a compound layer of Al and Cr formed between Cr particles and Al contained in the target is 5 μm or less, and
   wherein the relative density of the target is 92% or more.

2. A method of manufacturing a target for cathode discharging arc ion plating, comprising:
   sintering a powder mixture of elements forming the target by a HIP method in which the processing temperature is 420° C. to lower than 485° C.;
   wherein said target comprises
   Al and Cr,
   wherein the thickness of a compound layer of Al and Cr formed between Cr particles and Al contained in the target is 5 μm or less,
   wherein the total for the peak intensities of an Al–Cr compound is 10% or less relative to the total for the peak intensities of Al, Cr and the Al–Cr compound and relative density is 92% or more, said the peak intensities being observed between diffraction angles from 10 to 60° by X-ray diffractiometry according to θ=2θ method by using CuKα.

3. The method as defined in claim 1, wherein total amount for Al and Cr in the target is 3% or more, and the atom ratio between Al and Cr is Al:Cr=1:9 to 9:1 in the target.

4. The method as defined in claim 1, wherein a powder mixture of Al powder and a Cr powder is formed integrally by a HIP method.

5. The method as defined in claim 1, comprising 5 at % or more of Cr.

6. The method as defined in claim 1, wherein the number of Cr particles having a circle-equivalent diameter of 150 μm or more in the target is 10 or less in average when observed by five or more fields of view for the field of view 1.5 mm².

7. The method as defined in claim 2, wherein total amount for Al and Cr in the target is 3% or more, and the atom ratio between Al and Cr is Al:Cr=1:9 to 9:1 in the target.

8. The method as defined in claim 2, wherein a powder mixture of Al powder and a Cr powder is formed integrally by a HIP method.

9. The method as defined in claim 2, comprising 5 at % or more of Cr.

10. The method as defined in claim 2, wherein the number of Cr particles having a circle-equivalent diameter of 150 μm or more in the target is 10 or less in average when observed by five or more fields of view for the field of view 1.5 mm².

11. A method of manufacturing a target for cathode discharging arc ion plating, comprising:
    sintering a powder mixture of elements forming the target, by a hot forging method;
    wherein said target comprises
    Al and Cr,
    wherein the thickness of a compound layer of Al and Cr formed between Cr particles and Al contained in the target is 5 μm or less, and
    wherein the relative density of the target is 92% or more.

12. A method of manufacturing a target for cathode discharging arc ion plating, comprising:
    sintering a powder mixture of elements forming the target, by a hot forging method;
    wherein said target comprises
    Al and Cr,
    wherein the thickness of a compound layer of Al and Cr formed between Cr particles and Al contained in the target is 5 μm or less,
    wherein the total for the peak intensities of an Al-Cr compound is 10% or less relative to the total for the peak intensities of Al, Cr and the Al—Cr compound and relative density is 92% or more, said the peak intensities being observed between diffraction angles from 10 to 60° by X-ray diffractiometry according to θ=2θ method by using CuKα.

13. A method of manufacturing a target for cathode discharging arc ion plating, comprising:
    sintering a powder mixture of elements forming the target by a HIP method in which a processing temperature is 420° C. to 520° C. at a pressure of 100MPa to 200 MPa;
    wherein said target comprises
    Al and Cr,
    wherein the thickness of a compound layer of Al and Cr formed between Cr particles and Al contained in the target is 5 μm or less, and
    wherein the relative density of the target is 92% or more.

* * * * *